(12) United States Patent
Kino et al.

(10) Patent No.: US 7,834,731 B2
(45) Date of Patent: Nov. 16, 2010

(54) FERRITE SHEET

(75) Inventors: Hiroyuki Kino, Higashiomi (JP);
Hideyuki Mihara, Higashiomi (JP);
Toshiyuki Odagaki, Higashiomi (JP);
Masamichi Andoh, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 200 days.

(21) Appl. No.: 11/968,318

(22) Filed: Jan. 2, 2008

(65) Prior Publication Data
US 2008/0213615 A1    Sep. 4, 2008

Related U.S. Application Data

(63) Continuation of application No. PCT/JP2006/312018, filed on Jun. 15, 2006.

(30) Foreign Application Priority Data

Jul. 7, 2005    (JP) ............................. 2005-198936

(51) Int. Cl.
*H01F 27/02*    (2006.01)
*H01F 27/24*    (2006.01)
*H01F 17/06*    (2006.01)
*H01F 7/08*    (2006.01)
*H01B 7/29*    (2006.01)

(52) U.S. Cl. .................. 336/92; 336/212; 336/233; 336/175; 174/36; 174/117; 428/928; 428/929

(58) Field of Classification Search .................. None
See application file for complete search history.

(56) References Cited

U.S. PATENT DOCUMENTS 3,932,250 A * 1/1976 Sato et al. .................. 156/213
4,597,812 A * 7/1986 Hamilton .................... 156/63
4,873,505 A * 10/1989 Matsui ....................... 336/92
5,343,184 A * 8/1994 Matsui et al. ............... 336/92
5,821,845 A   10/1998 Ohashi
6,143,406 A * 11/2000 Uchida et al. .............. 428/336
6,346,673 B1 * 2/2002 Onizuka .................... 174/36
6,369,318 B1 * 4/2002 Uchida et al. ............... 174/36

FOREIGN PATENT DOCUMENTS

JP    2-45697 U    3/1990

(Continued)

OTHER PUBLICATIONS

Official communication issued in the International Application No. PCT/JP2006/312018; mailed on Aug. 29, 2006.

*Primary Examiner*—Anh T Mai
*Assistant Examiner*—Mangtin Lian
(74) *Attorney, Agent, or Firm*—Keating & Bennett, LLP

(57) ABSTRACT

A ferrite sheet includes a ferrite sintered body capable of being in direct and sufficiently close contact with a signal cable and has good noise removal properties. The ferrite sheet includes a flexible sheet having a foldable portion, a plurality of ferrite sintered bodies located in a region other than the foldable portion on the flexible sheet, an elastic body arranged around the ferrite sintered bodies on the flexible sheet, and an adhesive layer arranged on the elastic body such that the elastic body is bonded to itself when the flexible sheet is bent along the foldable portion.

13 Claims, 8 Drawing Sheets

FOREIGN PATENT DOCUMENTS

| | | | | |
|---|---|---|---|---|
| JP | 11-317310 A | | 11/1999 | |
| JP | 2000-286128 A | * | 10/2000 | |
| JP | 2000-286128 A | | 10/2000 | |
| JP | 2000286128 A | * | 10/2000 | |
| JP | 2001-167933 A | * | 6/2001 | |
| JP | 2001-167933 A | * | 6/2001 | |
| JP | 2001167933 A | * | 6/2001 | |
| JP | 2002-204094 A | * | 7/2002 | |
| JP | 2002-204094 A | * | 7/2002 | |
| JP | 2002204094 A | * | 7/2002 | |
| JP | 2002-368478 A | * | 12/2002 | |
| JP | 2002-368478 A | * | 12/2002 | |
| JP | 2002368478 A | * | 12/2002 | |

\* cited by examiner

FERRITE SHEET

BACKGROUND OF THE INVENTION

1. Field of the Invention

The present invention relates to a ferrite sheet and, in particular, a ferrite sheet for use on a signal cable to prevent leakage and ingress of radio waves and/or to reduce or remove noise superimposed on a signal.

2. Description of the Related Art

Various wave absorbers for use on signal cables to prevent noise leakage from or ingress into electronic apparatuses or electronic components have been provided.

One known example of wave absorbers of this type is a wave absorber that includes a ferrite sintered body whose both surfaces are covered with tape, as described in Japanese Unexamined Patent Application Publication No. 2002-204094. As illustrated in FIG. 21, in the wave absorber, both surfaces of ferrite sintered bodies 63 are covered with pieces of tape 65 and 67. The wave absorber is attached to a signal cable 61 by bonding the tape 67 to the signal cable 61.

However, when the wave absorber described in Japanese Unexamined Patent Application Publication No. 2002-204094 is attached on the signal cable 61, the tape 67 is present between the signal cable 61 and the ferrite sintered bodies 63. Therefore, it is difficult for this wave absorber to sufficiently remove noise.

FIG. 22 is a graph illustrating frequency characteristics of impedance of a signal cable sandwiched between two ferrite sintered bodies, each having dimensions of 20.0 mm×15.0 mm×1.0 mm, for a distance (gap) between the ferrite sintered bodies of 0.2 mm, 0.3 mm, 0.4 mm, and 0.5 mm. As illustrated in FIG. 22, the mean value of impedance decreases with an increase in the gap. The mean value is reduced as much as approximately 10% from that for a gap of 0.3 mm to that for a gap of 0.4 mm, which is 0.1 mm larger than 0.3 mm. A reduction in the mean value of impedance results in a reduction in noise removal properties. This shows that the presence of the tape 67 between the signal cable 61 and the ferrite sintered bodies 63 increases the gap and thus results in the reduction in the noise prevention properties.

Depending on the material of the signal cable 61, bonding of the tape 67 and the signal cable 61 may be insufficient. This may cause the tape 67 to peel off by vibration of the signal cable 61, so there is a possibility to separate the ferrite sintered bodies 63 from the signal cable 61.

SUMMARY OF THE INVENTION

In order to overcome the problems described above, preferred embodiments of the present invention provide a ferrite sheet that includes a ferrite sintered body capable of being in direct and sufficiently close contact with a signal cable and that has good noise removal properties.

A ferrite sheet according to a preferred embodiment of the present invention includes: a flexible sheet including a foldable portion; a plurality of ferrite sintered bodies located in a region other than the foldable portion on the flexible sheet; an elastic body disposed around the ferrite sintered bodies on the flexible sheet; and an adhesive layer arranged on the elastic body such that the elastic body is bonded to itself when the flexible sheet is bent along the foldable portion.

The ferrite sheet according to a preferred embodiment of the present invention is used when being bent along the foldable portion and sandwiching the signal cable. The ferrite sheet prevents leakage and ingress of radio waves and/or reduces or removes noise superimposed on a signal using the ferrite sintered bodies. In such a ferrite sheet, because the ferrite sintered bodies are in direct contact with the signal cable, good noise removal effects can be obtained. Because the elastic body is bonded to itself using the adhesive layer, the adhesion is excellent. Additionally, because the ferrite sheet is fixed such that the signal cable is sandwiched using the elastic body, each of the ferrite sintered bodies can be constantly in close contact with the signal cable by virtue of elasticity of the elastic body even when vibrations occur in the signal cable. Further increased noise removal effects can be obtained by virtue of the close contact of the ferrite sintered body and the signal cable.

In the ferrite sheet according to a preferred embodiment of the present invention, the ferrite sintered bodies may preferably be arranged substantially symmetrical with respect to the foldable portion. Therefore, when the ferrite sheet is bent along the foldable portion, the ferrite sintered bodies exactly coincide with each other in plan view, thus resulting in good noise removal effects.

The flexible sheet may preferably be substantially rectangular in plan view, and the foldable portion may be positioned in an approximately central region of the flexible sheet in a longitudinal direction thereof. The foldable portion positioned in the approximately central region prevents the adhesive layer from being exposed, and this can prevent the ferrite sheet from adhering to adjacent electronic components.

The flexible sheet may preferably be substantially rectangular in plan view, and the elastic body may preferably be disposed on at least the foldable portion and both end regions of the flexible sheet. Therefore, when the ferrite sheet is bent along the foldable portion, the elastic body disposed on the foldable portion can be bonded to itself and the elastic body arranged on both end regions of the flexible sheet can be bonded to itself using the adhesive layer, and the ferrite sheet can be fixed so as to sandwich the signal cable. As a result, the ferrite sintered bodies and the signal cable can be in sufficiently close contact with each other.

The foldable portion may preferably include a bending facilitating section. The bending facilitating section may be a cut section formed in the elastic body or an indentation section formed in the flexible sheet. The bending facilitating section may be a section where the elastic body is not formed on the flexible sheet, a dividing section where the flexible sheet is divided, or a section where the loose sheet is bonded to itself. The provision of the bending facilitating section enables the flexible sheet to be easily bent along the foldable portion, thus facilitating attachment of the ferrite sheet to the signal cable.

In the ferrite sheet according to a preferred embodiment of the present invention, a fixing sheet on which no elastic body is provided may preferably be added to the flexible sheet. Bending the ferrite sheet along the foldable portion and fixing the ferrite sheet with the fixing sheet placed thereon enables the ferrite sheet to be firmly fixed to the signal cable.

Each of the ferrite sintered bodies may include divided ferrite sintered body sections. The divided ferrite sintered body sections mean that each section is small and thin. Therefore, the ferrite sintered body has a reduced tendency to break and chip. The ferrite sintered body sections are allowed to be bent therebetween, so the ferrite sheet can be widely attached to even a curved signal cable.

The plurality of ferrite sintered bodies may have different sizes from each other. Therefore, even if misalignment occurs during attachment, an overlapping area between the ferrite sintered bodies in plan view has a reduced tendency to change. As a result, stable noise absorbing properties can be obtained.

In accordance with various preferred embodiments of the present invention, the ferrite sheet includes a flexible sheet including a foldable portion, a plurality of ferrite sintered bodies disposed in a region other than the foldable portion on the flexible sheet, an elastic body arranged around the ferrite sintered bodies on the flexible sheet, and an adhesive layer arranged on the elastic body such that the elastic body is bonded to itself when the flexible sheet is bent along the foldable portion. Therefore, the ferrite sintered bodies are in direct and sufficiently close contact with the signal cable. As a result, good noise removal effects can be obtained.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIGS. 5A-5C illustrate a modification of the ferrite sheet illustrated in FIG. 1; wherein FIG. 5A is a plan view thereof, FIG. 5B is a cross-sectional view thereof, and FIG. 5C is a frontal view thereof.

FIGS. 11A and 11B illustrate yet another modification of the ferrite sheet illustrated in FIG. 8; wherein FIG. 11A is a plan view thereof, and FIG. 11B is a cross-sectional view thereof.

FIGS. 14A and 14B illustrate a ferrite sheet according to a third preferred embodiment; wherein FIG. 14A is a plan view thereof, and FIG. 14B is a cross-sectional view thereof.

FIGS. 17A and 17B illustrate a ferrite sheet according to a fourth preferred embodiment; wherein FIG. 17A is a plan view thereof, and FIG. 17B is a cross-sectional view thereof.

FIGS. 19A and 19B illustrate a ferrite sheet according to a fifth embodiment; wherein FIG. 19A is a plan view thereof, and FIG. 19B is a cross-sectional view thereof.

DETAILED DESCRIPTION OF PREFERRED EMBODIMENTS

Preferred embodiments will be described below with reference to the accompanying drawings.

First Preferred Embodiment

Figure 1:
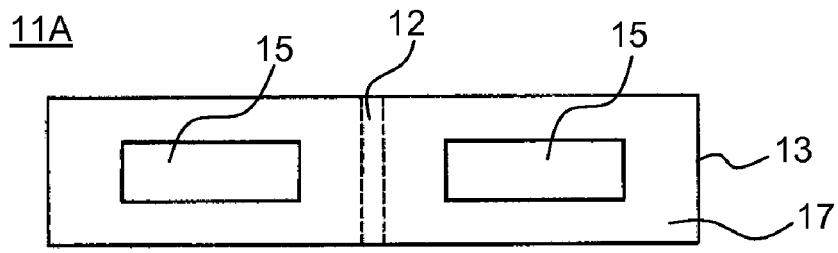
FIG. 1 is a plan view of a ferrite sheet according to a first preferred embodiment of the present invention.
Figure 2:
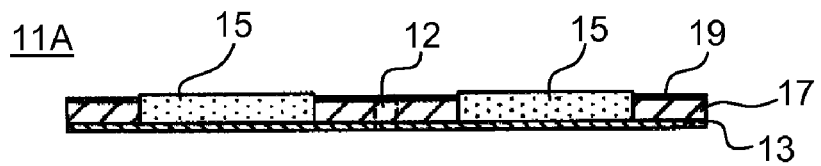
FIG. 2 is a cross-sectional view of the ferrite sheet according to the first preferred embodiment of the present invention.

FIG. 1 is a plan view of a ferrite sheet according to a preferred first embodiment, and FIG. 2 is a cross-sectional view thereof. As illustrated in FIG. 1, a ferrite sheet 11A according to the first preferred embodiment preferably includes a flexible sheet 13 having a foldable portion 12 (whose area is indicated by dashed lines) and two ferrite sintered bodies 15 disposed on the sheet 13. The foldable portion 12 is positioned in an approximately central region of the sheet 13 in the longitudinal direction thereof. The foldable portion 12 indicates any region at which the ferrite sheet 11A is foldable on the sheet 13. The ferrite sintered bodies 15 are disposed in a region other than the foldable portion 12 and arranged substantially symmetrical with respect to the foldable portion 12. As illustrated in FIG. 2, an elastic body 17 is arranged around the ferrite sintered bodies 15 on the sheet 13. An adhesive layer 19 is arranged on the elastic body 17 such that the elastic body 17 is bonded to itself when the sheet 13 is bent along the foldable portion 12.

The sheet 13 is preferably composed of resin or rubber and is preferably substantially rectangular in plan view. A surface of the sheet 13 on which the ferrite sintered bodies 15 and the elastic body 17 are to be formed has adhesion. This adhesion of the sheet 13 fixes the ferrite sintered bodies 15 and the elastic body 17 onto the sheet 13. When the sheet 13 is composed of a material having elasticity, the ferrite sheet 11A is attachable to a signal cable having various thicknesses.

Each of the ferrite sintered bodies 15 preferably is predominantly composed of Ni—Zn and preferably is substantially rectangular in plan view. The elastic body 17 preferably is composed of urethane.

In an example of the first preferred embodiment, the sheet 13 has dimensions of about 14 mm long by about 9 mm wide (which is the size of one side measured from the foldable portion 12), and the ferrite sintered body 15 has dimensions of about 10 mm long by about 5 mm wide by about 0.5 mm high, for example. It is, of course, understood that the materials and dimensions of the sheet 13, the ferrite sintered body 15, and the elastic body 17 are merely examples.

Figure 3:
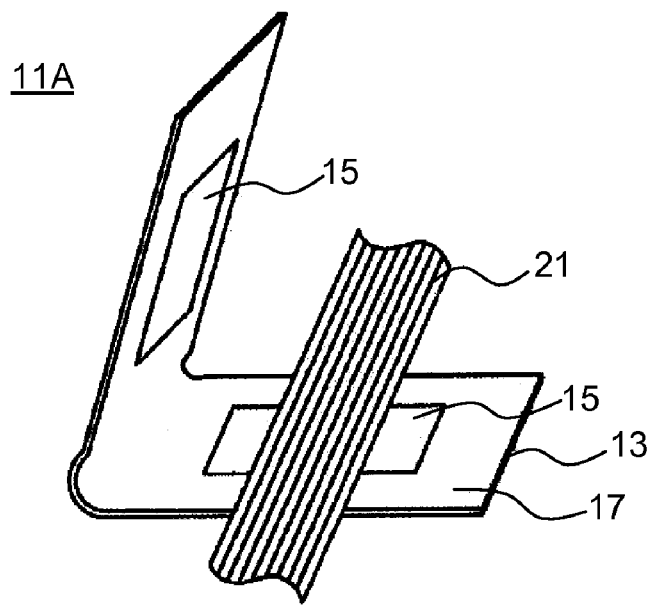
FIG. 3 is a perspective view of the ferrite sheet in use illustrated in FIGS. 1 and 2.
Figure 4:
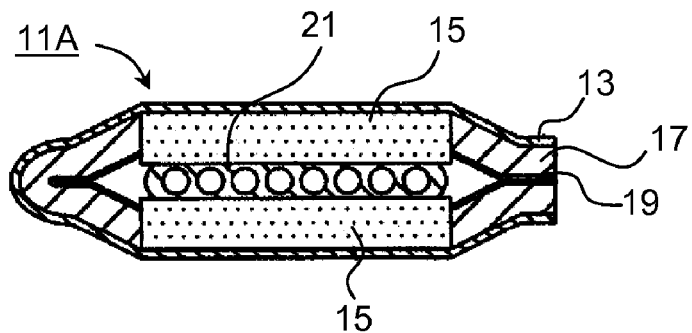
FIG. 4 is a cross-sectional view of the ferrite sheet in use in FIG. 3.

As illustrated in FIG. 3, the ferrite sheet 11A is used when sandwiching a signal cable 21 by being folded along the foldable portion 12 such that the ferrite sintered bodies 15 and the elastic body 17 are positioned inside. As illustrated in FIG. 4, which illustrates a cross-sectional view in use, the elastic body 17 is bonded to itself using the adhesive layer 19, thereby fixing the ferrite sheet 11A to the signal cable 21.

Because the ferrite sintered bodies 15 are in direct contact with the signal cable 21, good noise removal effects can be obtained. Because the elastic body 17 is bonded to itself via the adhesive layer 19, the adhesion is excellent. In addition, because the ferrite sheet 11A is fixed to the signal cable 21 such that the signal cable 21 is sandwiched using the elastic body 17. Therefore, even when vibrations occur in the signal cable 21, the ferrite sintered bodies 15 can be constantly and continuously in close contact with the signal cable 21 by virtue of the elasticity of the elastic body 17.

Because the ferrite sintered bodies 15 and the elastic body 17 are disposed on the flexible sheet 13, the signal cable 21 can be sandwiched between the ferrite sintered bodies 15 so as to be in direct and sufficiently close contact therewith irrespective of the size of the signal cable 21.

Because the elastic body 17 is disposed around the ferrite sintered bodies 15, even if the ferrite sintered bodies 15 are broken, the elastic body 17 can prevent fragments of the broken ferrite sintered bodies 15 from flying.

Additionally, in the first preferred embodiment, because the foldable portion 12 is disposed in an approximately central region of the sheet 13, the adhesive layer 19 is not exposed and thus the ferrite sheet 11A does not adhere to adjacent electronic components. Because the ferrite sintered bodies 15 are arranged substantially symmetrical with respect to the foldable portion 12, the ferrite sintered bodies 15 in use coincide with each other in plan view, thus resulting in good noise removal properties.

As illustrated in FIG. 2, in the ferrite sheet 11A of the first preferred embodiment, the thickness of the elastic body 17 is smaller than that of each of the ferrite sintered bodies 15. This enables the ferrite sintered bodies 15 to be pressed against the signal cable 21 when the signal cable 21 is sandwiched, as illustrated in FIG. 4. Therefore, the adhesion of the ferrite sintered bodies 15 to the signal cable 21 can be further increased.

Figure 5A:
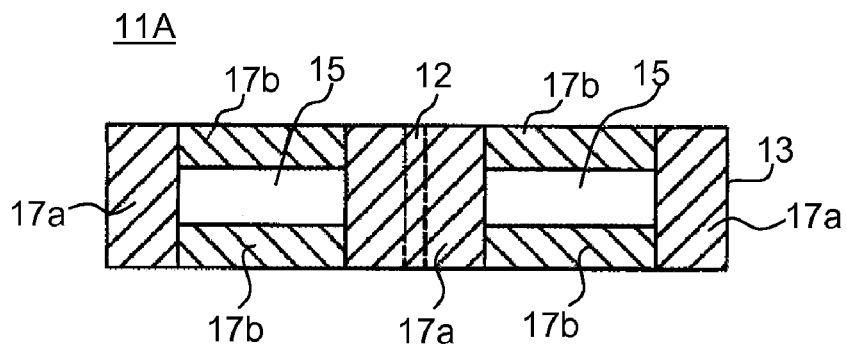
Figure 5B:
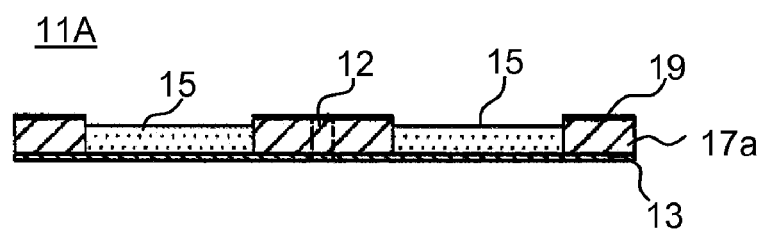
Figure 5C:
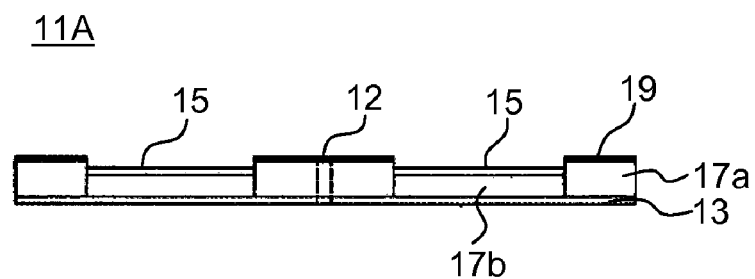
Figure 6:
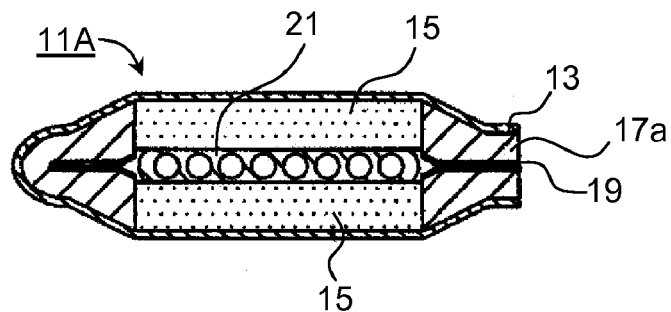
FIG. 6 is a cross-sectional view of the ferrite sheet in use illustrated in FIGS. 5A-5C.

The thickness of the elastic body 17 formed on the foldable portion 12 and on both end regions of the sheet 13 may be larger than that of each of the ferrite sintered bodies 15. That is, as illustrated in FIGS. 5A-5C, an elastic body portion 17a located on the foldable portion 12 and on both end regions of the sheet 13 may have a larger thickness than the ferrite sintered body 15, whereas an elastic body portion 17b at the other area may have a smaller thickness than the ferrite sintered body 15. This enables the elastic body portion 17a to sufficiently support the ferrite sintered bodies 15 positioned outside the signal cable 21 and being not in contact therewith when the signal cable 21 is sandwiched, as illustrated in FIG. 6. This can prevent breakage of the ferrite sintered bodies 15.

Figure 7:
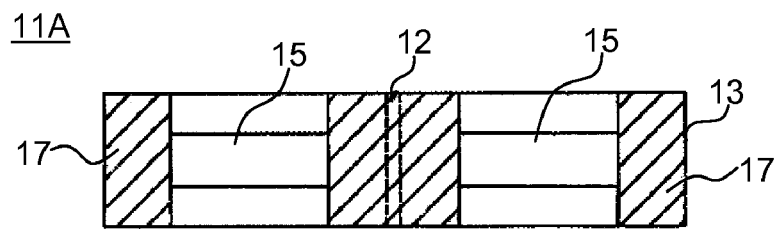
FIG. 7 is a plan view of another modification of the ferrite sheet illustrated in FIG. 1.

When the elastic body 17 is disposed on the foldable portion 12 and on both end regions of the sheet 13, the elastic body 17 is bonded to itself, thus enabling the ferrite sintered bodies 15 to be in direct and sufficiently close contact with the signal cable 21. As a result, as illustrated in FIG. 7, the elastic body 17 may not be formed in a region other than the foldable portion 12 and both end regions of the sheet 13.

Second Preferred Embodiment

Figure 8:
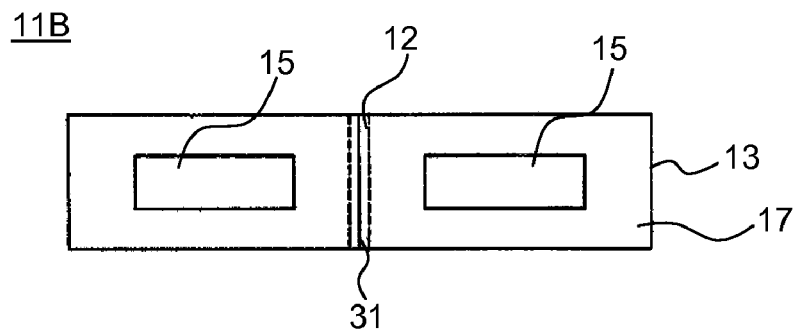
FIG. 8 is a plan view of a ferrite sheet according to a second preferred embodiment of the present invention.

As illustrated in FIG. 8, a ferrite sheet 11B according to a second preferred embodiment is basically the same as the ferrite sheet 11A according to the first preferred embodiment in that the ferrite sintered bodies 15 and the elastic body 17 are disposed on the sheet 13, but is different in that the elastic body 17 disposed on the foldable portion 12 between the ferrite sintered bodies 15 has a cut section 31. The provision of the cut section 31 to the elastic body 17 facilitates bending of the sheet 13 along the foldable portion 12, thus facilitating attachment of the ferrite sheet 11B to the signal cable.

In the ferrite sheet 11B of the second preferred embodiment, the cut section 31 is formed in a straight line. However, the cut section 31 may be formed in a broken line or a chain line. The cut section 31 may reach the sheet 13 or may have a depth that does not reach the sheet 13.

Figure 9:
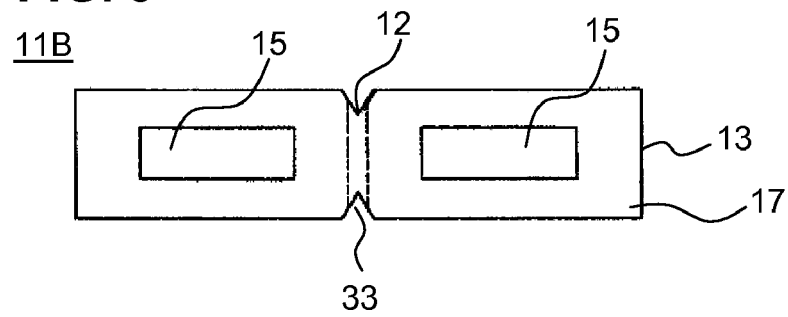
FIG. 9 is a plan view of a modification of the ferrite sheet illustrated in FIG. 8.
Figure 10:
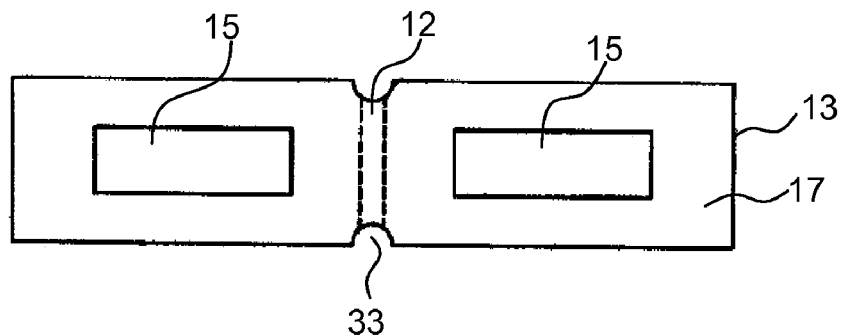
FIG. 10 is a plan view of another modification of the ferrite sheet illustrated in FIG. 8.

A bending facilitating section for facilitating bending of the sheet 13 is not limited to the cut section 31 formed in the elastic body 17. As illustrated in FIG. 9, the bending facilitating section may be an indentation section 33 formed in the sheet 13. The indentation section 33 may be substantially triangular, as illustrated in FIG. 9, or substantially semicircular, as illustrated in FIG. 10.

Figure 11A:
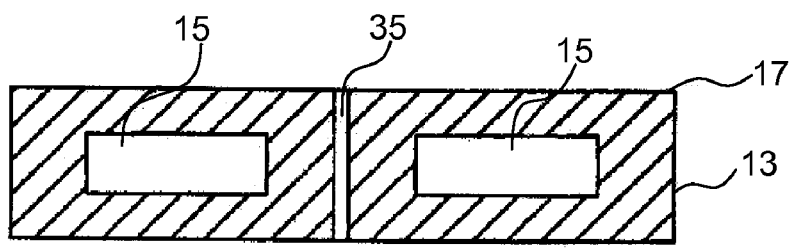
Figure 11B:
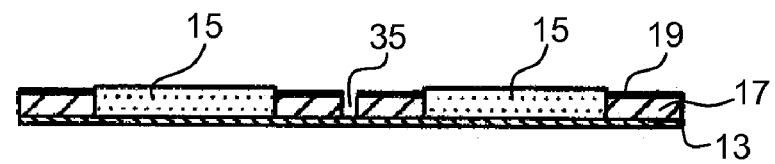

As illustrated in FIGS. 11A and 11B, the bending facilitating section may be a section 35 where the elastic body 17 is not formed on the sheet 13. The section 35, where the elastic body 17 is not formed on the sheet 13, facilitates bending of the sheet 13, thus facilitating attachment of the ferrite sheet 11B to the signal cable.

Figure 12:
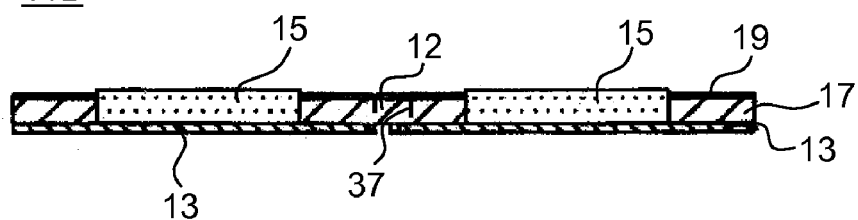
FIG. 12 is a cross-sectional view of still another modification of the ferrite sheet illustrated in FIG. 8.

As illustrated in FIG. 12, the bending facilitating section may be a dividing section 37 where the sheet 13 is divided. The dividing section 37, where the sheet 13 is divided into two parts at the foldable portion 12, facilitates bending of the sheet 13, thus facilitating attachment of the ferrite sheet 11B to the signal cable.

Figure 13A:
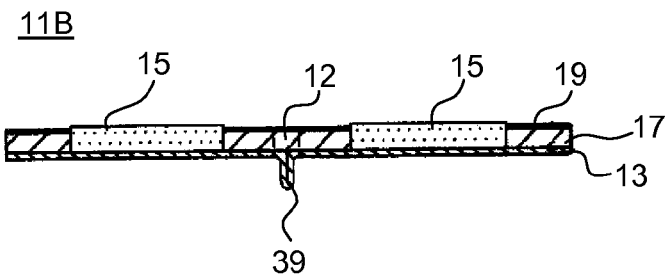
FIGS. 13A and 13B are cross-sectional views of other modifications of the ferrite sheet illustrated in FIG. 8.
Figure 13B:
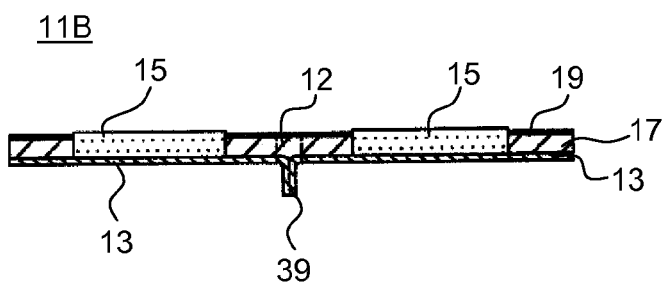

As illustrated in FIG. 13A, to facilitate bending of the sheet 13, the sheet 13 may be bonded to itself at a loose portion. This facilitates bending of the sheet 13, while at the same time facilitating holding of the ferrite sheet 11B by grasping a bonded section 39 of the sheet 13. As a result, handling of the ferrite sheet 11B is facilitated. Using a single sheet 13 is not necessarily required to bond the sheet 13 to itself. As illustrated in FIG. 13B, two sheets may be bonded together at the foldable portion 12.

Third Preferred Embodiment

Figure 14A:
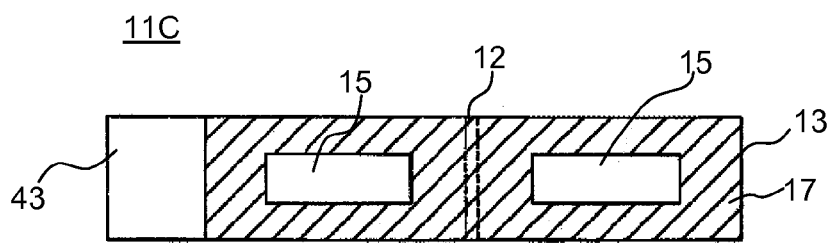
Figure 14B:
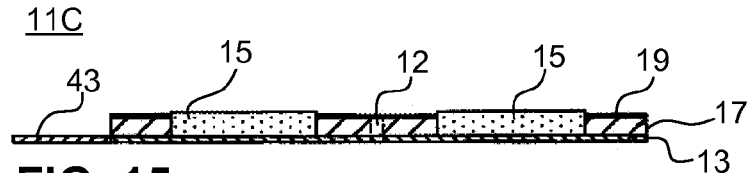

As illustrated in FIGS. 14A and 14B, a ferrite sheet 11C according to a third preferred embodiment includes a fixing sheet 43 added to one side of the sheet 13 in the longitudinal direction thereof. The elastic body 17 is not disposed on the fixing sheet 43. The fixing sheet 43 is formed integrally with the sheet 13, on which the elastic body 17 is disposed. Other configurations are substantially the same as in the ferrite sheet 11A of the first preferred embodiment.

Figure 15:
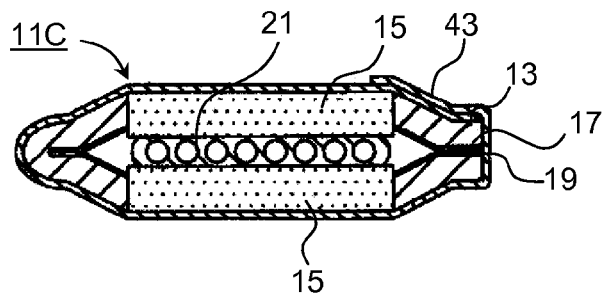
FIG. 15 is a cross-sectional view of the ferrite sheet in use illustrated in FIGS. 14A and 14B.

According to the ferrite sheet 11C, as illustrated in FIG. 15, when the ferrite sheet 11C is bent along the foldable portion 12, the fixing sheet 43 can be placed on the elastic body 17 and a surface of the sheet 13 on which the elastic body 17 is not formed. A surface of the fixing sheet 43 that is to adhere to the elastic body 17 and the sheet 13 has adhesion. This adhesion fixes the fixing sheet 43. This can resist separation of the elastic body 17 bonded to itself on both end regions of the ferrite sheet 11C. As a result, the ferrite sheet 11C can be firmly fixed to the signal cable 21.

Figure 16:
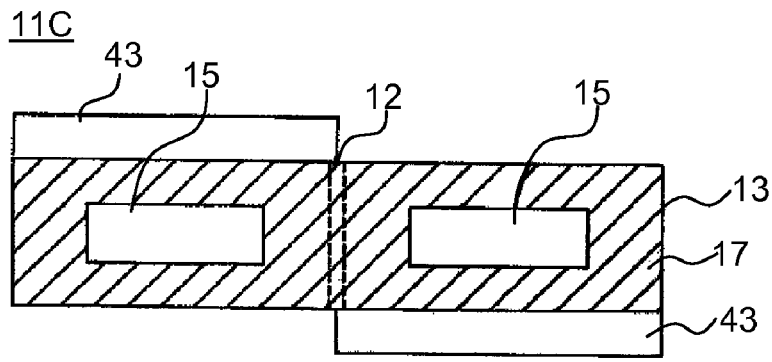
FIG. 16 is a plan view of a modification of the ferrite sheet illustrated in FIGS. 14A and 14B.

To firmly fix the ferrite sheet 11C to the signal cable 21, it is preferable that the fixing sheet 43 have a length of about 1 mm or longer, for example. The position of the fixing sheet 43 added to the sheet 13 is not limited to in the longitudinal direction thereof. As illustrated in FIG. 16, the fixing sheet 43 may be added along a shorter side of the sheet 13.

Fourth Preferred Embodiment

Figure 17A:
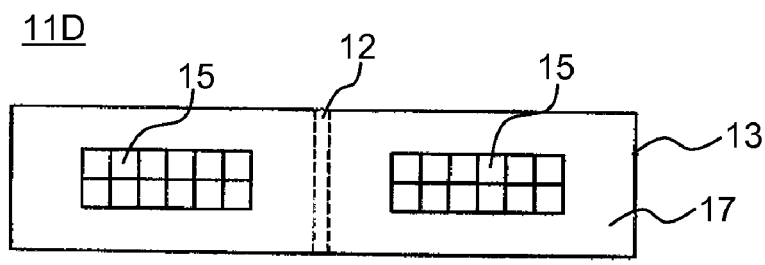
Figure 17B:
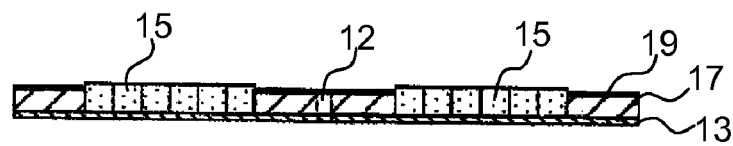

As illustrated in FIGS. 17A and 17B, in a ferrite sheet 11D according to a fourth preferred embodiment, each of the ferrite sintered bodies 15 is divided into a plurality of sections. Other configurations are substantially the same as in the ferrite sheet 11A of the first preferred embodiment.

Figure 18:
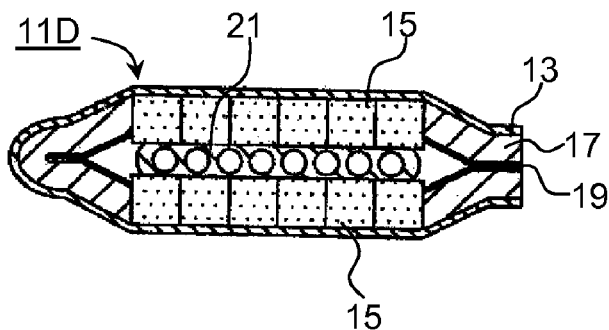
FIG. 18 is a cross-sectional view of the ferrite sheet in use illustrated in FIGS. 17A and 17B.

The ferrite sheet 11D is attached to the signal cable 21, as illustrated in FIG. 18. Because each of the ferrite sintered bodies 15 is divided into a plurality of sections, which means that each section is small and thin, the ferrite sintered body has a reduced tendency to break and chip, the size and shape of the ferrite sheet 11D can be altered easily, and the manufacturing cost can be reduced. Because the divided ferrite sintered body sections are aligned, they are bendable. Thus, the ferrite sheet 11A can support a curve of the signal cable 21.

Fifth Preferred Embodiment

Figure 19A:
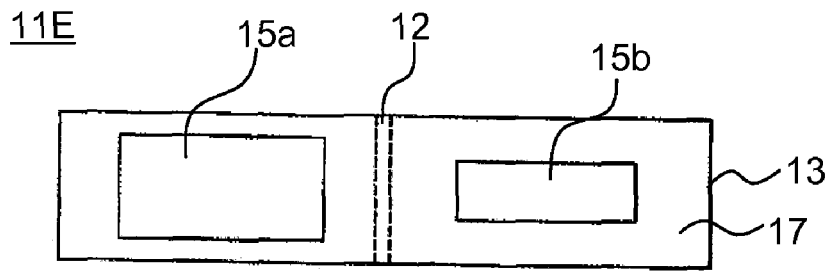
Figure 19B:
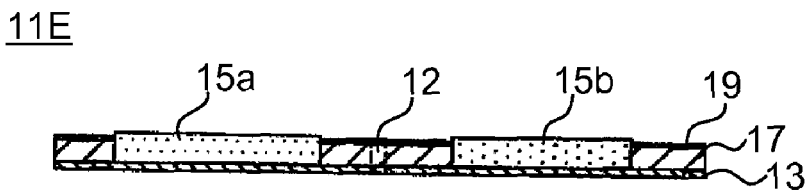

As illustrated in FIGS. 19A and 19B, a ferrite sheet 11E according to a fifth preferred embodiment includes ferrite sintered bodies 15a and 15b preferably having different sizes. More specifically, the size of the ferrite sintered body 15a preferably is larger than that of the ferrite sintered body 15b. Other configurations are substantially the same as in the ferrite sheet 11A of the first preferred embodiment.

Figure 20:
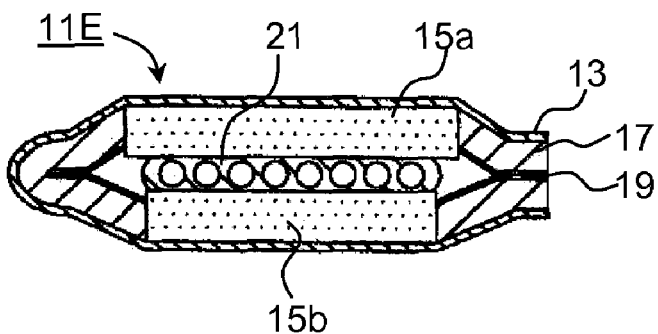
FIG. 20 is a cross-sectional view of the ferrite sheet in use illustrated in FIGS. 19A and 19B.
Figure 21:
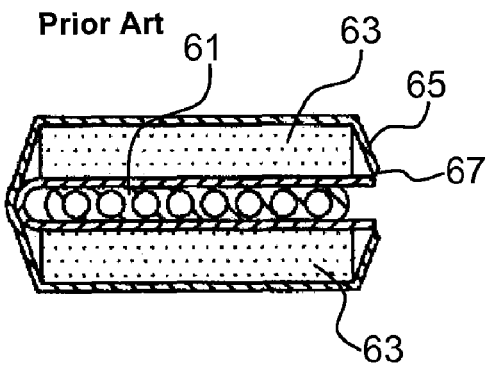
FIG. 21 is a cross-sectional view of a known wave absorber in use.
Figure 22:
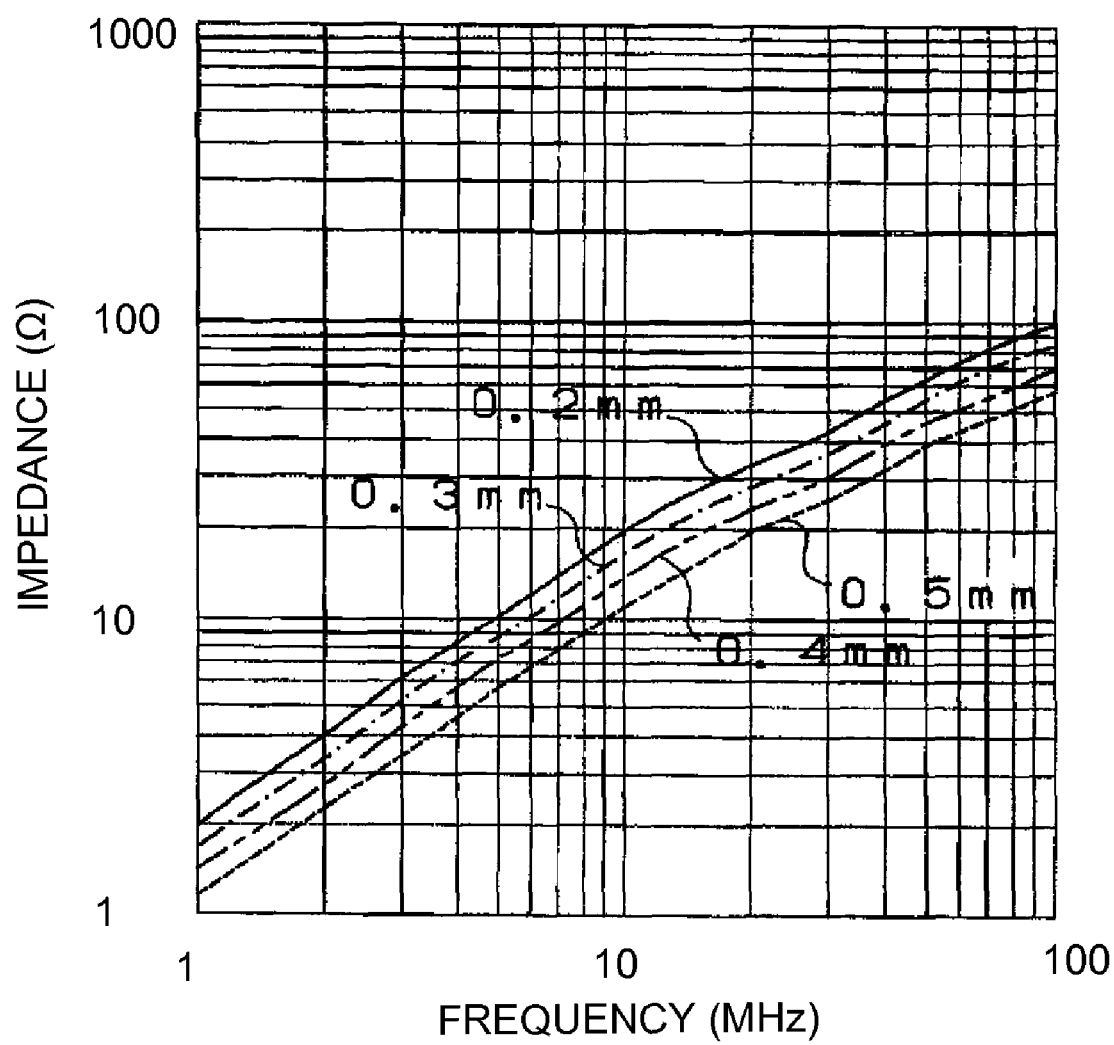
FIG. 22 is a graph that illustrates frequency characteristics of impedance.

In the ferrite sheet 11E, because the ferrite sintered bodies 15a and 15b have different sizes, even if the signal cable 21 becomes misaligned when the ferrite sheet 11E is attached on the signal cable 21, as illustrated in FIG. 20, an overlapping area between the ferrite sintered bodies 15a and 15b has a reduced tendency to change. Therefore, stable noise absorbing properties can be obtained.

Other Preferred Embodiments

A ferrite sheet according to the present invention is not limited to the above-described preferred embodiments. It is, of course, understood that various modifications may be made within the scope thereof. For example, two ferrite sintered bodies formed on the sheet in the above-described preferred embodiments can be replaced with three or more ferrite sintered bodies. The elastic body can be composed of non-woven fabric, Japanese paper, or rubber. Alternatively, the elastic body itself may have adhesion.

As described above, various preferred embodiments of the present invention are useful for a ferrite sheet to prevent leakage or ingress of radio waves and/or to reduce or remove noise. In particular, it is excellent in that the ferrite sintered bodies are in direct and sufficiently close contact with the signal cable and the ferrite sheet has good noise removal properties.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A ferrite sheet comprising:
   a flexible sheet including a foldable portion;
   a plurality of ferrite sintered bodies located in a region other than the foldable portion on the flexible sheet;
   an elastic body arranged around the ferrite sintered bodies on the flexible sheet; and
   an adhesive layer arranged on the elastic body such that the elastic body is bonded to itself when the flexible sheet is bent along the foldable portion.

2. The ferrite sheet according to claim 1, wherein the ferrite sintered bodies are arranged substantially symmetrical with respect to the foldable portion.

3. The ferrite sheet according to claim 1, wherein the flexible sheet is substantially rectangular in plan view, and
   the foldable portion is positioned in an approximately central region of the flexible sheet in a longitudinal direction thereof.

4. The ferrite sheet according to claim 1, wherein the flexible sheet is substantially rectangular in plan view, and the elastic body is disposed on at least the foldable portion and both end regions of the flexible sheet.

5. The ferrite sheet according to claim 1, wherein the foldable portion includes a bending facilitating section.

6. The ferrite sheet according to claim 5, wherein the bending facilitating section comprises a cut section formed in the elastic body.

7. The ferrite sheet according to claim 5, wherein the bending facilitating section comprises an indentation section formed in the flexible sheet.

8. The ferrite sheet according to claim 5, wherein the bending facilitating section comprises a section where the elastic body is not located on the flexible sheet.

9. The ferrite sheet according to claim 5, wherein the flexible sheet is divided into at least two parts, and the bending facilitating section comprises a dividing section where the flexible sheet is divided.

10. The ferrite sheet according to claim 5, wherein the bending facilitating section comprises a section where the flexible sheet is bonded to itself.

11. The ferrite sheet according to claim 1, wherein a fixing sheet on which no elastic body is provided is added to the flexible sheet.

12. The ferrite sheet according to claim 1, wherein each of the ferrite sintered bodies comprises divided ferrite sintered body sections.

13. The ferrite sheet according to claim 1, wherein the plurality of ferrite sintered bodies have different sizes from each other.

* * * * *